United States Patent
Arai et al.

(10) Patent No.: US 7,400,307 B2
(45) Date of Patent: Jul. 15, 2008

(54) DRIVING CIRCUIT FOR VACUUM FLUORESCENT DISPLAY

(75) Inventors: Hiroyuki Arai, Gunma (JP); Syuji Motegi, Tochigi (JP); Takeshi Kimura, Tochigi (JP); Tetsuya Tokunaga, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 702 days.

(21) Appl. No.: 10/808,586

(22) Filed: Mar. 25, 2004

(65) Prior Publication Data
US 2004/0207574 A1 Oct. 21, 2004

(30) Foreign Application Priority Data
Mar. 26, 2003 (JP) ............... 2003-086463
Mar. 26, 2003 (JP) ............... 2003-086464

(51) Int. Cl.
*G09G 3/22* (2006.01)
(52) U.S. Cl. .................... 345/75.1; 315/169.3
(58) Field of Classification Search ................ 315/77, 315/169.1–169.3; 345/47, 102, 691, 75.1
See application file for complete search history.

(56) References Cited

U.S. PATENT DOCUMENTS

| 4,340,889 | A | * | 7/1982 | Knight et al. | 345/691 |
| 4,968,917 | A | * | 11/1990 | Harris | 315/77 |
| 6,005,538 | A | * | 12/1999 | Hoekstra | 345/47 |
| 7,113,163 | B2 | * | 9/2006 | Nitta et al. | 345/102 |
| 2002/0171614 | A1 | | 11/2002 | Yoshitami et al. | |

FOREIGN PATENT DOCUMENTS

JP 2002-108263 4/2002

* cited by examiner

*Primary Examiner*—Amare Mengistu
*Assistant Examiner*—Yuk Chow
(74) *Attorney, Agent, or Firm*—Fish & Richardson P.C.

(57) ABSTRACT

A driving circuit for a vacuum fluorescent display having a filament, a grid electrode and a segment electrode, the driving circuit comprising a filament driving unit for driving the filament; a grid driving unit for pulse-driving the grid electrode; and a segment driving unit for pulse-driving the segment electrode, wherein the driving circuit comprises a controlling unit for validating or invalidating the output of the filament driving unit at a proper timing.

19 Claims, 11 Drawing Sheets

| W3 | W2 | W1 | W0 | VALUE SET FOR Wn | FPC PULSE WIDTH |
|---|---|---|---|---|---|
| 0 | 0 | 0 | 0 | — | — |
| 0 | 0 | 0 | 1 | 3 | 3/fosc |
| 0 | 0 | 1 | 0 | 4 | 4/fosc |
| ~ | ~ | ~ | ~ | ~ | ~ |
| 0 | 1 | 1 | 0 | 8 | 8/fosc |
| ~ | ~ | ~ | ~ | ~ | ~ |
| 1 | 1 | 1 | 0 | 16 | 16/fosc |
| 1 | 1 | 1 | 1 | 17 | 17/fosc |

| C6 | C5 | C4 | C3 | C2 | C1 | C0 | VALUE SET FOR Cn | FPC PULSE CYCLE |
|---|---|---|---|---|---|---|---|---|
| 0 | 0 | 0 | 0 | 0 | 0 | 0 | — | — |
| 0 | 0 | 0 | 0 | 0 | 0 | 1 | — | — |
| 0 | 0 | 0 | 0 | 0 | 1 | 0 | 4 | 4/fosc |
| 0 | 0 | 0 | 0 | 0 | 1 | 1 | 5 | 5/fosc |
| ~ | ~ | ~ | ~ | ~ | ~ | ~ | ~ | ~ |
| 1 | 0 | 0 | 0 | 1 | 1 | 0 | 72 | 72/fosc |
| ~ | ~ | ~ | ~ | ~ | ~ | ~ | ~ | ~ |
| 1 | 1 | 1 | 1 | 1 | 1 | 0 | 128 | 128/fosc |
| 1 | 1 | 1 | 1 | 1 | 1 | 1 | 129 | 129/fosc |

| DIMMER ADJUSTMENT DATA | | | | | | | | | | DIMMER VALUE (TW/T) |
|---|---|---|---|---|---|---|---|---|---|---|
| DM9 | DM8 | DM7 | DM6 | DM5 | DM4 | DM3 | DM2 | DM1 | DM0 | |
| 0 | 0 | 0 | 0 | 0 | 0 | 0 | 0 | 0 | 0 | 0/1024 |
| 0 | 0 | 0 | 0 | 0 | 0 | 0 | 0 | 0 | 1 | 1/1024 |
| 0 | 0 | 0 | 0 | 0 | 0 | 0 | 0 | 1 | 0 | 2/1024 |
| ≀ | | | | | | | | | | ≀ |
| 1 | 1 | 1 | 1 | 1 | 1 | 1 | 1 | 0 | 0 | 1020/1024 |
| 1 | 1 | 1 | 1 | 1 | 1 | 1 | 1 | 0 | 1 | 1021/1024 |
| 1 | 1 | 1 | 1 | 1 | 1 | 1 | 1 | 1 | 0 | 1022/1024 |
| 1 | 1 | 1 | 1 | 1 | 1 | 1 | 1 | 1 | 1 | IMPOSSIBLE TO SET |

(a)

(b)

-- PRIOR ART --

-- PRIOR ART --

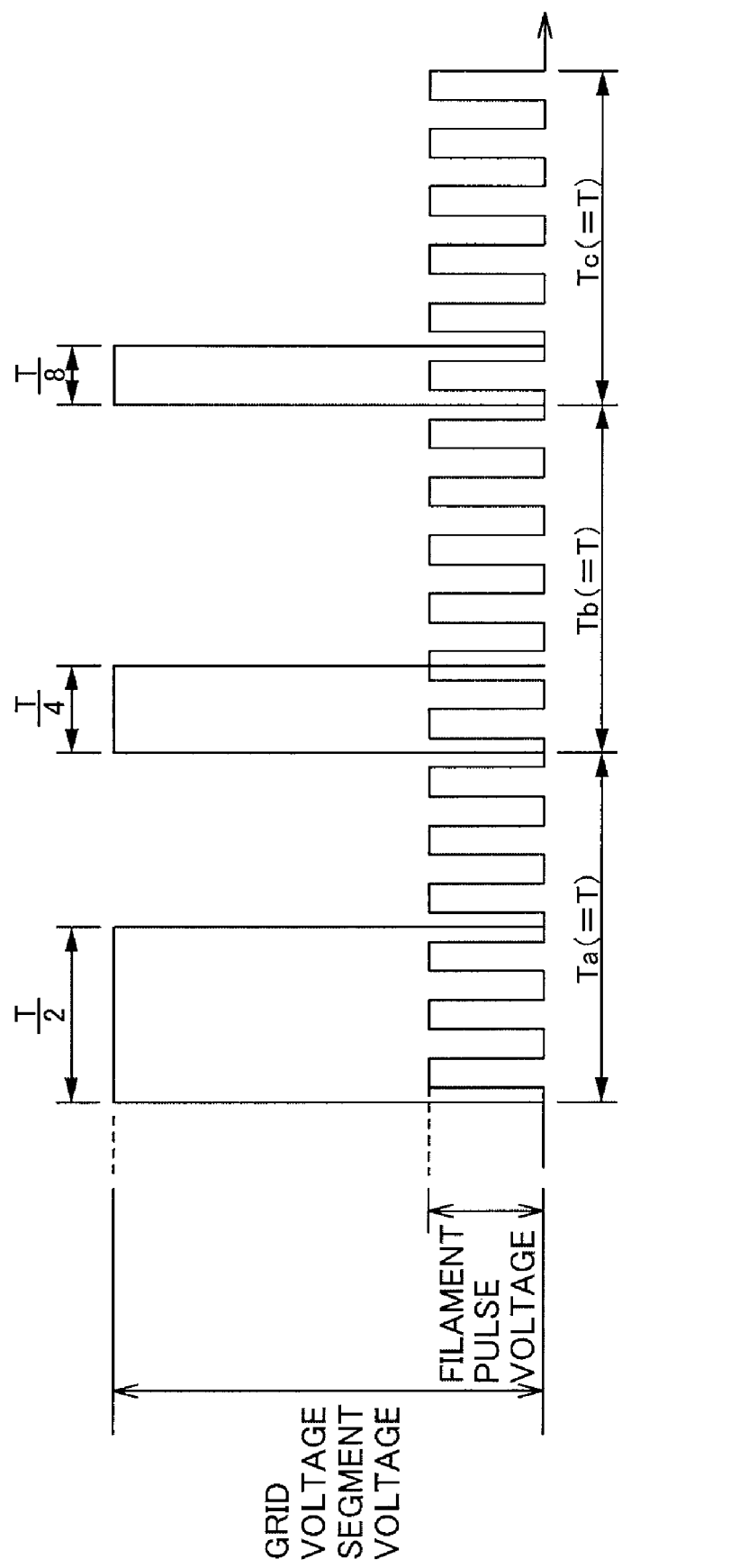
FIG. 14 — PRIOR ART —

DRIVING CIRCUIT FOR VACUUM FLUORESCENT DISPLAY

CROSS-REFERENCE TO RELATED APPLICATIONS

This application claims the benefit of priority to Japanese Patent Application Nos. 2003-86464 and 2003-86463 filed on Mar. 26, 2003, of which contents are incorporated herein by reference.

BACKGROUND OF THE INVENTION

1. Field of the Invention

The present invention relates to a driving circuit for a vacuum fluorescent display.

2. Description of the Related Art

A vacuum fluorescent display (hereinafter, referred to as "VFD") is a display device of a self-illuminating type for displaying a desired pattern by causing a direct-heating type cathode called a filament to emit thermoelectrons by causing the filament to generate heat by applying a voltage thereto in A vacuum chamber, and by causing the thermoelectrons to collide against fluorescent material on an anode (segment) electrode and causing it to illuminate, by accelerating the thermoelectrons using a grid electrode. VFDs have excellent features in terms of visibility, multi-coloring, a low operating voltage, reliability (environmental resistance) etc. and are utilized in various applications and fields such as cars, home appliances and consumer products.

For a VFD, as one scheme for applying a voltage to its filament, pulse-driving scheme has been proposed. Pulse-driving scheme is a scheme in which a pulse voltage (hereinafter, referred to as "filament pulse voltage") generated by chopping a DC voltage relatively high compared to the ordinary nominal voltage of the filament is applied to the filament, and an illuminating state having a small intensity gradient etc. can be obtained.

FIG. 13 illustrates a conventional pulse-driving scheme. As shown in the figure, in the conventional pulse-driving scheme, a filament pulse voltage having a constant duty ratio is set in an external oscillator 30 or an external controller 40 based on a reference clock signal (an oscillation clock for the external oscillator 30 or a system clock for the external controller 40) and is continuously applied to a filament 11.

As an example of VFD driving circuit using a conventional driving scheme such as the external oscillator 30 or the external controller 40 (hereinafter, referred to as "conventional VFD driving circuit"), there is a technology disclosed in Japanese Patent Application Laid-open Publication No. 2002-108263.

Furthermore, in a conventional VFD driving circuit, a mechanism for adjusting the intensity of a VFD 10 is provided such that the VDF 10 can be displayed with proper intensity in response to the surrounding environmental conditions (such as the environmental illumination intensity) when operating the VFD 10. As mechanisms for adjusting the intensity of the VFD 10, a scheme called "grid dimming" in which the duty ratio of a voltage applied to a grid electrode 12 (hereinafter, referred to as "grid voltage") is adjusted and a scheme called "anode dimming" in which the duty ratio of a voltage applied to a segment (anode) electrode 13 (hereinafter, referred to as "segment voltage") is adjusted are commonly used. Hereinafter, the grid dimming and the anode dimming are collectively referred to as "dimming".

Here, a conventional VFD driving circuit executes dimming based on a reference table of dimmer adjustment data and dimmer values as shown in FIG. 12 (a), for example. The dimmer adjustment data is data correlated to values that can be set as the duty ratios of the grid voltage and the segment voltage and are designated when dimming is executed by an external device to the VFD driving circuit. The dimmer adjustment data can be bit number of binary data in response to the resolution of dimming such as, for example, 10-bit binary data (DM0-DM9) in which DM0 shown in FIG. 12 (a) is the LSB (Least Significant Bit). On the other hand, the dimmer value is a value that can be set as the duty ratio described above, and can be defined as "pulse width TW/pulse cycle T" using the pulse width TW and the pulse cycle T shown in the wave form diagram in FIG. 12 (b).

== First Task ==

FIG. 14 shows a wave form diagram of the main signal in the case where dimming is executed such that the duty ratios of the grid voltage and the segment voltage are reduced by "½", "¼", "⅛", in a state that a conventional VFD driving circuit keeps applying a filament pulse voltage having a constant duty ratio to the filament 11. The time period in which both of the grid voltage and the segment voltage shown in the figure are at a level H represents a time period that is at a voltage by which both of the grid electrode 12 and the segment electrode 13 are driven (hereinafter, referred to as "ON period") and, during that time period, it is assumed that fluorescent material on the driven segment electrode 13 illuminates and a desired pattern is displayed on the VFD 10.

Here, during the ON period, in the time period in which the filament pulse voltage is at the level H, the intensity of the VFD 10 is reduced because the potential difference between the filament, and the grid electrode and the segment electrode becomes small. Furthermore, as shown in FIG. 14, the ON period becomes shorter and the rate of the time period in which the filament pulse voltage is at the level H increases in the ON period as the duty ratios of the grid voltage and the segment voltage are reduced. Therefore, the reduction of the intensity of the VFD 10 as described above becomes remarkable (It is said that the duty ratio, "⅛" of the grid voltage and the segment voltage is the minimum threshold).

That is, in the conventional VFD driving circuit, dimming is executed such that the duty ratios of the grid voltage and the segment voltage are reduced in order to reduce the intensity of the VFD 10. In this case, the rate of reduction in the intensity of the VFD 10 becomes larger, as the rate of the occupation in the time period in which the filament pulse voltage is at the level H receives influence to become larger in the ON period than that of the rate of the reduction in intensity of the VFD 10 based on the dimming. Therefore, for the conventional VFD driving circuit, it has been a challenge to execute desired intensity adjustment by dimming when the ON period is short.

== Second Task ==

In the conventional VFD driving circuit, the filament pulse voltage is designed to be applied to the filament at a constant duty ratio while fluctuation of the duty ratio is caused by variations and thermal properties of elements driving the filament and fluctuation of the filament power voltage etc. Furthermore, due to the fluctuation of the duty ratio, the effective value of the filament pulse voltage goes out of the tolerance defined for its nominal value (for example, nominal value±approximately 10%) and a problem has been raised, that degrading is caused for the intensity grade of the VFD display and the life of the VFD display is shortened due to degradation of the filament.

Then, in recent years, demand for improvement in further reliability has been increased for the VFD driving circuit.

Therefore, in order to cope with the above problems, it is required to equip a mechanism for finely adjusting the duty ratio of the filament pulse voltage at an appropriate timing (improving the resolution). In the conventional VFD driving circuit, it is possible to improve the resolution relating to the adjustment of the duty ratio of the filament pulse voltage by setting high the frequency of the reference clock signal that is to set the filament pulse voltage.

However, in the conventional VFD driving circuit, the power consumption increases and, concurrently, noises interfering with apparatuses such as radio are generated when the frequency of the reference clock signal is set at a too high frequency in order to improve the resolution relating to the adjustment of the duty ratio of the filament voltage. On the other hand, when the frequency of the reference clock signal is set at a low frequency (the cycle is made longer), the frequency of the filament pulse voltage is also decreased. Thus, the frequency of the filament pulse voltage reaches within the audible band (generally, 20 kHz or lower) and sound noises are generated from the filament.

As described above, the method of adjusting the frequency of the reference clock signal, the problems described above might occur. Therefore, a new technique is sought for a mechanism for adjusting the duty ratio of the filament pulse voltage.

SUMMARY OF THE INVENTION

In order to solve the above problems, a major aspect of the present invention provides a driving circuit for a vacuum fluorescent display having a filament, a grid electrode and a segment electrode comprising a filament driving unit for driving the filament; a grid driving unit for pulse-driving the grid electrode; a segment driving unit for pulse-driving the segment electrode; and a controlling unit for validating or invalidating the output of the filament driving unit at a proper timing.

In case of invalidating the output of the filament driving unit, the controlling unit may invalidate the output of the filament driving unit for a time period TW when a voltages is reached at which the grid electrode and the segment electrode are driven by the grid driving unit and the segment driving unit, respectively, and when the time period TW to reach the voltage is shorter than a predetermined time period. The controlling unit may enable a pulse width and/or a pulse cycle of a pulse driving signal for pulse-driving the filament to be set based on data received from exterior According to the invention it is possible to improve the convenience and reliability of a driving circuit for a vacuum fluorescent display using the pulse-driving scheme of its filament, making it possible to provide a driving circuit usable for a vacuum fluorescent display.

Other features of the invention will become clear on understanding the description herein and attached drawings.

BRIEF DESCRIPTION OF THE DRAWINGS

The above and other features, aspects and advantages of the invention will be understood more clearly with reference to the following description, appended claims and the attached drawings in which:

FIG. 14 illustrates the relation between the potentials of each electrode of the vacuum fluorescent display.

DETAILED DESCRIPTION OF THE INVENTION

Figure 1:
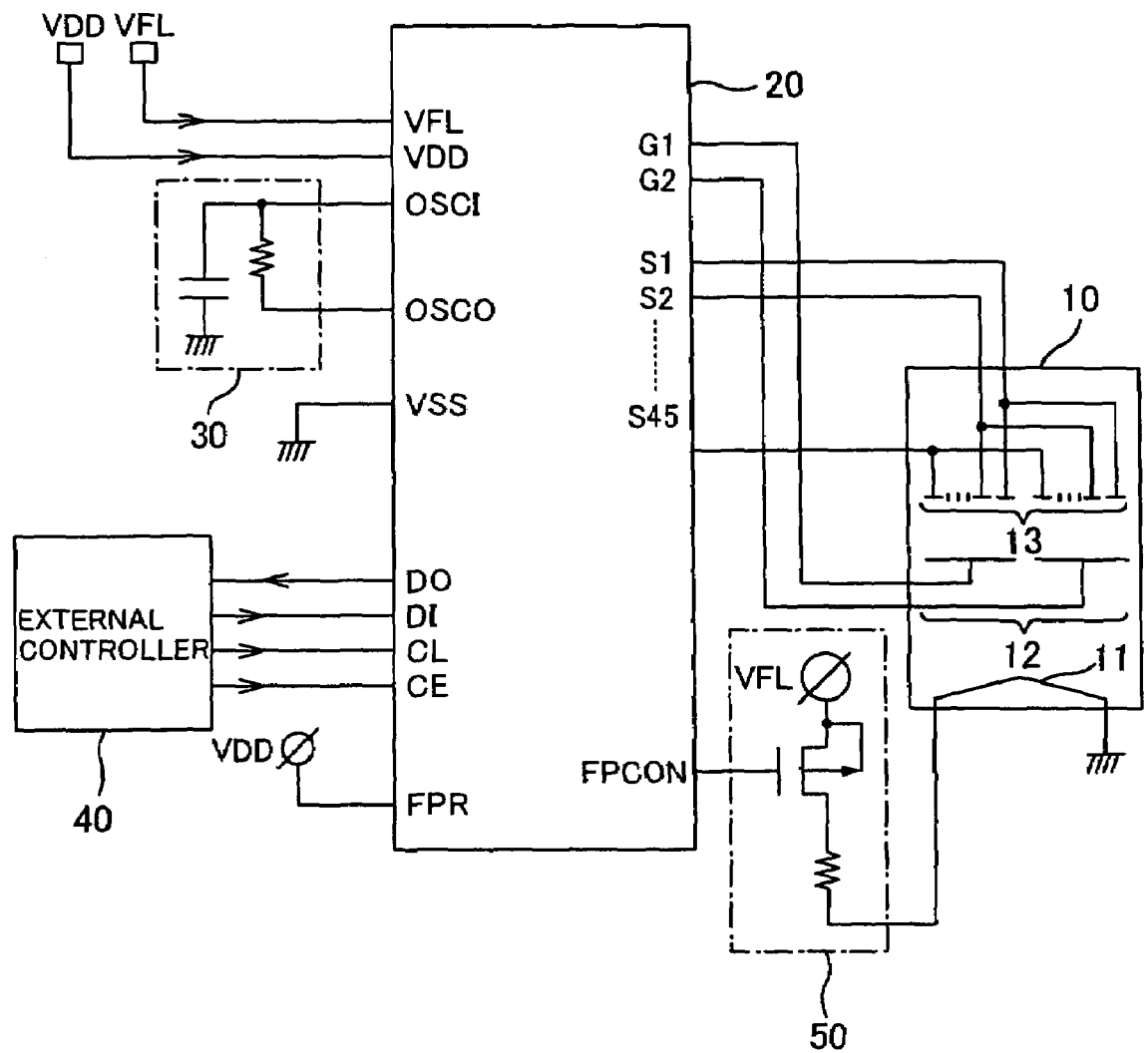
FIG. 1 shows schematically the composition of a system including a driving circuit for a vacuum fluorescent display according to an embodiment of the invention.

Embodiments of the invention will now be described in detail referring to the drawings.

<System Composition>

FIG. 1 shows schematically the composition of a system including a VFD driving circuit 20 according to an embodiment of the invention. As shown in the figure, a case will be described where the invention is implemented for the VFD driving circuit 20 corresponding to a "90" segment output assuming that the grid electrode 12 and the segment electrode 13 are driven in a dynamic driving scheme, the duty cycle (the pulse width/repetition cycle) of a grid driving signal to drive the grid electrode 12 is "½" (i.e., grid (column) is two-column).

The VFD driving circuit 20 according to an embodiment of the invention is not limited to the example with the above-described number of grids (two-column) and the number of segments (90 segments), and driving of the grid electrode 12 and the segment electrode 13 may be combined with a driving scheme of either the dynamic driving scheme or static driving scheme. For example, in the case where the static driving scheme is employed, all of the column display is executed by the segment electrodes 13 of the number same as the number of the segments and one (1) grid electrode 12. In this case, a constant voltage (grid voltage) is applied to the one (1) grid electrode 12.

The overview of the dynamic driving scheme and the static driving scheme described above is described in, for example, "Display Technologies Series: Vacuum Fluorescent Displays 8.2 The Basic Driving Circuits (pp. 154-158)", Sangyo Tosho.

As to the peripheral circuits of the VFD driving circuit 20, the VFD 10, the external oscillator 30, the external controller 40 and a switching element 50 will be described in this order.

The VFD 10 comprises the filament 11, the grid electrode 12 and the segment (anode) electrode 13. The filament 11 is heated by applying a filament pulse voltage based on the pulse driving scheme through the switching element 50, and emits thermoelectrons. The grid electrode 12 acts as an electrode for selecting columns and accelerates or blocks the thermoelectrons emitted by the filament 11. The segment electrode 13 acts as an electrode for selecting a segment. However, fluorescent material is applied on the surface of the segment electrode 13 in a shape of the pattern to be displayed, and a desired pattern is displayed by causing the fluorescent material to illuminate by causing the thermoelectrons to be accelerated by the grid electrode 12 and colliding them against the fluorescent material.

Furthermore, in the VFD 10, a lead is drawn out independently for each column respectively from the grid electrode 12 while a lead for which segments corresponding to each column are internally connected with each other is drawn out from the segment electrode 13. These leads drawn from the grid electrode 12 and the segment electrode 13 are connected respectively with corresponding output terminals of the VFD driving circuit 20 (grid output terminals are G1-G2 and segment output terminals are S1-S45).

An external oscillator 30 is a RC oscillator comprising a resistor R, a capacitance element C etc. and constitutes a RC oscillation circuit by being connected with oscillator terminals (OSCI terminal, OSCO terminal) of the VFD driving circuit 20. The external oscillator 30 may by a quartz-crystal oscillator or ceramic vibrator each having a specific oscillation frequency and a crystal as a self-driving oscillation unit or a ceramic oscillation circuit may by composed. Furthermore, the external oscillator 30 may be an externally-driven oscillating unit providing a clock signal for externally-driven oscillation to the VFD driving circuit 20.

The external controller 40 is an apparatus such as a microcomputer not containing any VFD driving element, and is connected with the VFD driving circuit 20 through data bus for transferring serial data, and transmits signals necessary for driving the VFD 10 to the VFD driving circuit 20 with a predetermined data transfer format. The data transfer between the external controller 40 and the VFD driving circuit 20 is not limited to the serial data transfer described above, but may be parallel data transfer.

The switching element 50 is a P-channel MOS-type FET and its gate terminal is connected with a FPCON terminal of the VFD driving circuit 20, outputting the pulse driving signal described later. The switching element 50 is not limited to the P-channel MOS-type FET and, for example, a N-channel MOS-type FET may be used and, in addition, a composition in which a N-channel MOS-type FET and a P-channel MOS-type FET combined may be used. Furthermore, the switching element 50 generates the filament pulse voltage to be applied to the filament 11 of the VFD 10 from a filament power voltage VFL by executing ON/OFF operation in response to the pulse driving signal provided from a FPCON terminal of the VFD driving circuit 20.

A FPR terminal of the VFD driving circuit 20 shown in FIG. 1 is an input terminal for setting the polarity of the pulse driving signal outputted from a FPCON terminal in response to the input/output property of the switching element 50 and, for example, as shown in FIG. 1, in the case where a P-channel MOS-type FET is employed as the switching element 50, the FPR terminal is connected with a power voltage VDD ("H"-fixed). In addition, in the case where a N-channel MOS-type FET is employed as the switching element 50, the FPR terminal is connected with ground ("L"-fixed).

Figure 2:
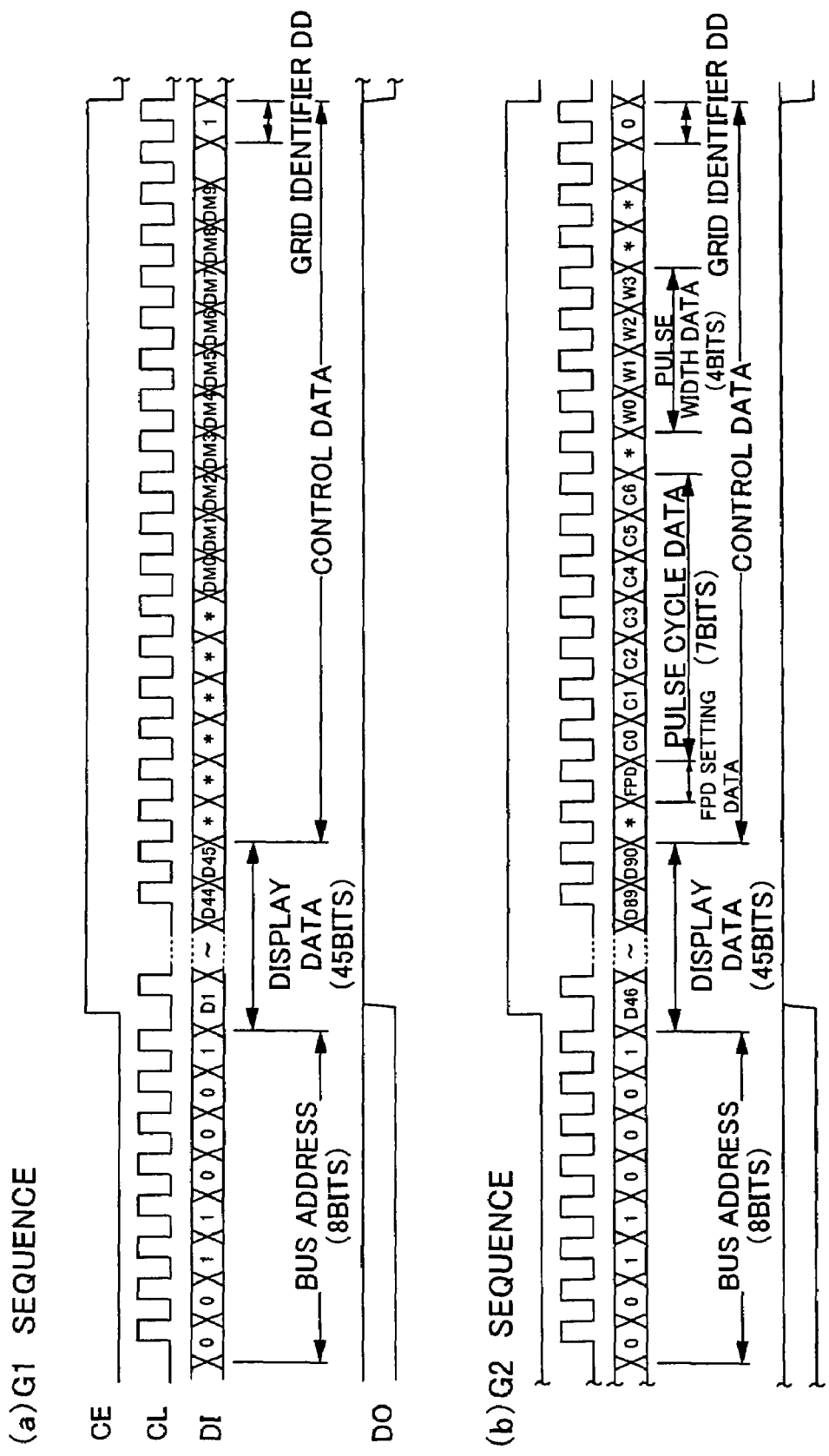
FIG. 2 is a timing chart for a data transfer format between an external controller and a vacuum fluorescent display according to an embodiment of the invention.

FIG. 2 shows a timing chart for a data transfer format between the external controller 40 and the VFD driving circuit 20. As shown in the figure, the data transfer format has a sequence relating to a grid electrode G1 (hereinafter, referred to as "G1 sequence") and a sequence relating to a grid electrode G2 (hereinafter, referred to as "G2 sequence"). The data transfer format is not limited to the format described above and both of the G1 sequence and the G2 sequence may be executed at one time.

The G1 sequence and the G2 sequence will be described schematically.

First, in the G1 sequence, the external controller 40 transmits to the VFD driving circuit 20 a bus address (8 bits) given to the VRD driving circuit 20 together with a synchronizing clock signal CL. The VFD driving circuit 20 identifies whether the received address is the bus address given to the circuit 20 itself or not. Then, when the circuit 20 identifies the bus address as the bus address given to the circuit 20 itself, the circuit 20 receives a control order (control data etc. described later) transmitted attached to the received bus address from the external controller 40 as a control order to the circuit 20 itself. As described above, a bus address is a specific address given to each respective IC and is used by the external controller 40 to control a plurality of ICs on the same bus line in an embodiment where the external controller 40 and the plurality of ICs are connected on the same bus line.

Next, the external controller 40 makes the VFD driving circuit 20 be in an enable (selection) state by asserting (putting at the level H) a chip enable signal CE and, then, transmits 45-bit display data (D1-D45) for the grid electrode G1, 16-bit control data used for each control of the VFD driving circuit 20 etc. The 16-bit control data contains dimmer adjustment data (DM0-DM9) for dimming, grid identifier DD (for example, "1" for the grid electrode G1 and "0" for the grid electrode G2) etc. Thereafter, the external controller 40 makes the VFD driving circuit 20 be in a disable (non-selection) state by negating (putting at level L) the chip enable signal CE and, concurrently, terminates the transmission of the synchronizing clock signal CL, then, the G1 sequence is concluded.

On the other hand, in the G2 sequence, in a same procedure as that of the G1 sequence described above, 45-bit display data (D46-D90) relating to the grid electrode G2 are transmitted. In the G2 sequence, the control data transmitted from the VFD driving circuit 20 contains FPD (Filament Pulse Disable) setting data described later, 7-bit pulse cycle data Cn (C0-C6) described later, 4-bit pulse width data Wn (W0-W3) etc.

<VFD Driving Circuit>

Figure 3:
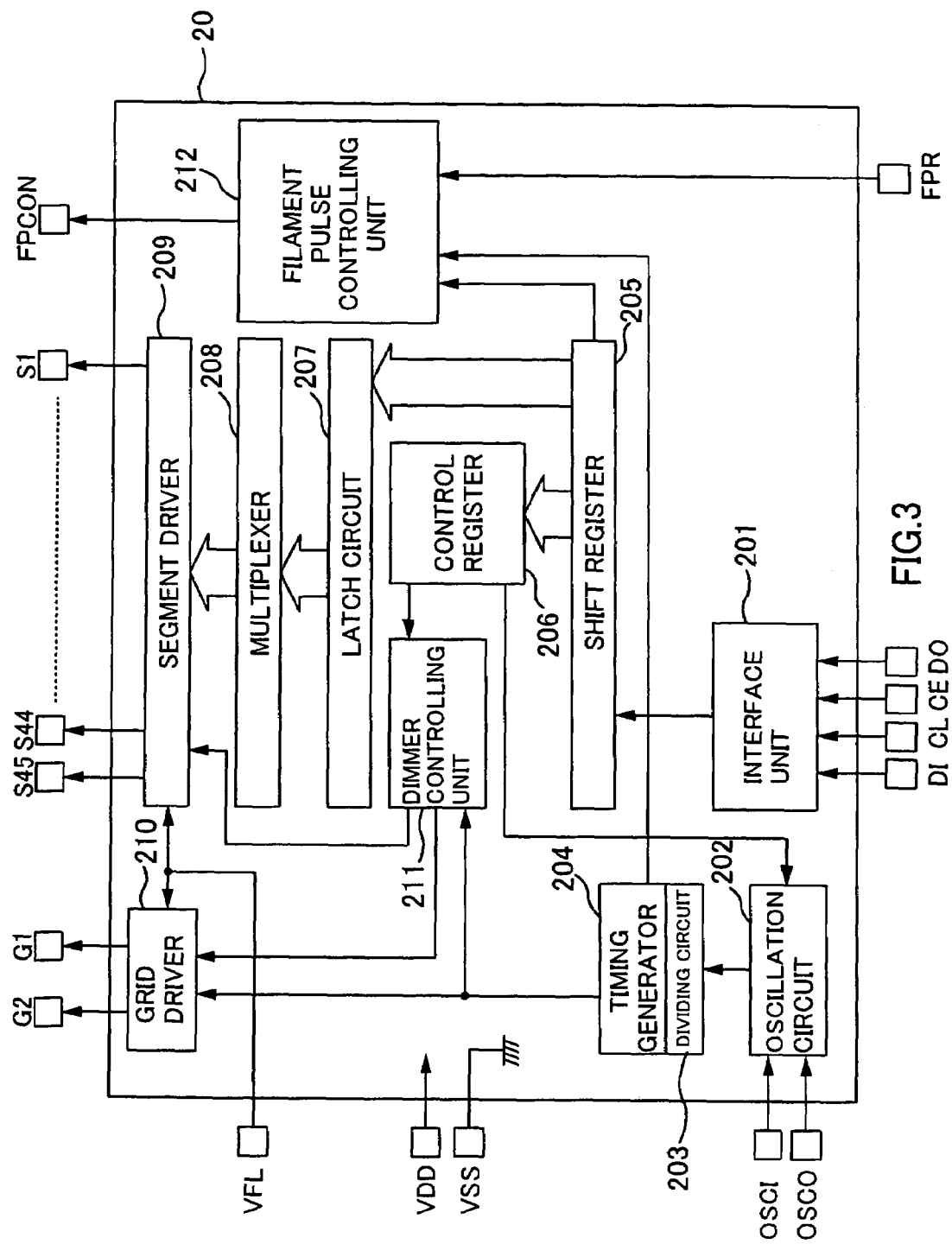
FIG. 3 is a block diagram of the driving circuit of the vacuum fluorescent display according to an embodiment of the invention.

FIG. 3 shows a block diagram of the VFD driving circuit 20 of the pulse driving scheme according to an embodiment of the invention.

The VFD driving circuit 20 comprises an interface unit 201, an oscillation circuit 202, a dividing circuit 203, a timing generator 204, a shift register 205, a control register 206, a latch circuit 207, a multiplexer 208, a segment driver 209, a grid driver 210, a dimmer controlling unit 211 and a filament pulse controlling unit 212.

The interface unit 201 is an interface unit for transmitting/receiving of data as shown in FIG. 2 with the external controller 40.

The oscillation circuit 202 generates the reference clock signal for the VFD driving circuit 20 by connecting the external oscillator 30 with the terminals for oscillator (OSCI, OSCO). This reference clock signal is divided into a predetermined dividing number by the dividing circuit 203 and supplied to the timing generator 204. The frequency of the reference clock signal (oscillation clock) is set in the audible band or above such that no sound noise is generated at the filament 11 and, concurrently, is set under a predetermined upper limit frequency taking into account the influence of the power consumption of the VFD driving circuit and radio noises.

The timing generator 204 outputs a signal (hereinafter, referred to as "internal clock signal A") for determining the timing etc. of a signal (hereinafter, referred to as "grid driving signal") for driving the grid electrodes G1-G2 based on the signal supplied from the dividing circuit 203, and a signal (hereinafter, referred to as "internal clock signal B") for determining the timing of a pulse driving signal described later in the filament pulse controlling unit 212, etc.

The shift register 205 converts the 45-bit display data and the 16-bit control data received at the interface unit 201 for each of the above-described G1 or G2 sequence, into parallel data and supplies them to the control register 206, the latch circuit 207, the filament pulse controlling unit 212 etc. The 16-bit control data contains the dimmer adjustment data, the FPD setting data, the pulse width data, the pulse cycle data, grid identifier DD etc.

The control register 206 stores the 32-bit (16 bits×2) control data supplied from the shift register 205. The dimmer adjustment data contained in the control data stored in the control register 206 is supplied to the dimmer controlling unit 211.

The latch circuit 207 retains the 45-bit display data relating to the grid electrode G1 and the 45-bit display data relating to the grid electrode G2. These display data are supplied from the shift register 205. That is, the latch circuit 207 retains 90-bit display data for each repetition cycle relating to the driving of the grid electrodes G1-G2.

The multiplexer 208 selects the 45-bit display data relating to either of the grid electrode G1 or G2 to be driven, from the 90-bit display data retained in the latch circuit 207 at the timing for driving each of the grid electrodes G1-G2, and supplies the data to the segment driver 209.

The segment driver 209 forms a signal for driving segment electrodes S1-S45 based on the 45-bit display data selected and supplied by the multiplexer 208, and outputs it to the segment electrodes S1-S45. The signal for driving the segment electrodes S1-S45 may be applied as voltages to the segment electrodes S1-S45 (hereinafter, referred to as "segment voltage") or a control signal to be supplied to a driving element intervened between the segment driver 209 and the segment electrodes S1-S45 (hereinafter, the segment voltage and the control signal are collectively referred to as "segment driving signal").

The grid driver 210 forms a grid driving signal based on the internal clock signal A supplied from the timing generator 204 and outputs it to the grid electrodes G1-G2. The signal for driving the grid electrodes G1-G2 may be applied as a voltage (hereinafter, referred to as "grid voltage") to the grid electrodes G1-G2 or a control signal to be supplied to a driving element intervened between the grid driver 210 and the grid electrodes G1-G2 (hereinafter, the grid voltage and the control signal are collectively referred to as "grid driving signal").

The dimmer controlling unit 211 adjusts the duty ratios of the segment driving signal and the grid driving signal based on the dimmer adjustment data supplied from the control registor 206.

The filament pulse controlling unit 212 forms the pulse driving signal for pulse-driving the filament 11 based on the internal clock signal B supplied from the timing generator 204 and outputs it to the switching element 50. The filament pulse controlling unit 212 sets the polarity of the pulse driving signal based on a signal supplied from the FPR terminal. For example, when the FPR terminal is "L"-fixed, the pulse driving signal has a waveform shown in FIG. 8.

The VFD driving circuit 20 according to the invention has a function for making the pulse driving signal outputted to the switching element 50 to be valid or invalid with a proper timing. The function is basically realized at the filament pulse controlling unit 212. The function that the pulse controlling unit 212 possesses is described in detail as follows.

First Embodiment

== Filament Pulse Controlling Unit ==

As a first embodiment according to the invention, the filament pulse controlling unit 212, in the case where the pulse driving signal is made invalid, has a function for making it invalid only for the time period in which the grid electrode 12 and the segment electrode 13 are at the voltage at which they are driven (hereinafter, referred to as "ON period").

Figure 4:
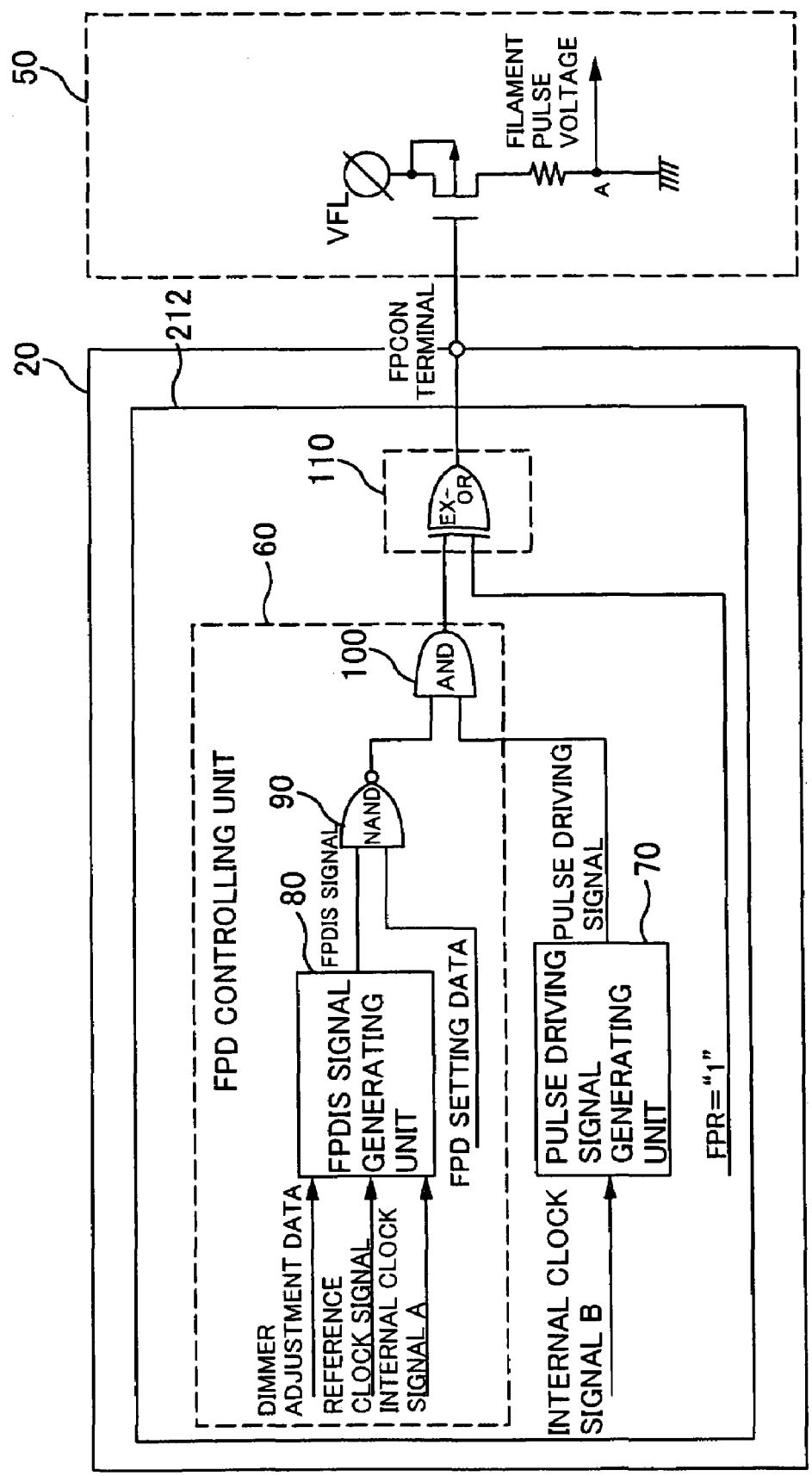
FIG. 4 is a block diagram of a filament pulse controlling unit according to an embodiment of the invention.

FIG. 4 shows a schematic block diagram of the filament pulse controlling unit 212 according to the first embodiment of the invention.

As shown in the figure, the filament pulse controlling unit 212 comprises a pulse driving signal generating unit 70, a FPD (Filament Pulse Disable) controlling unit 60 and a pulse driving signal polarity setting unit 110.

The pulse driving signal generating unit 70 generates the pulse driving signal having a predetermined duty ratio based on the internal clock signal B supplied from the timing generator 204.

The FPD controlling unit 60 comprises a FPDIS signal generating unit 80 for generating a signal (hereinafter, referred to as "FPDIS signal") for setting a time period in which the pulse driving signal is made invalid, an NAND element 90 as a unit capable of setting validity and invalidity of the FPDIS signal in response to FPD setting data received from the external controller 40 and an AND element 100 as a unit capable of setting validity and invalidity of the pulse driving signal generated by the pulse driving signal generating unit 70 in response to the output of the NAND element 90.

The FPD setting data means data capable of setting the function itself to be valid or invalid for making the pulse driving signal according to the invention to be invalid only for the ON period, for example, the data may be the data capable of setting the validity or invalidity of the FPDIS signal at the NAND element 90 as described above. The FPD setting data is set such that it makes the pulse driving signal invalid only for the ON period when it is at the level H and makes the pulse driving signal valid regardless of the ON period when it is at the level L.

The FPD controlling unit 60, based on the composition described above, when the FPD setting data received from the external controller 40 is set at the level H, makes the pulse driving signal generated by the pulse driving signal generator 70 invalid by fixing it at a predetermined level (for example, the level H) for the ON period. The FPD controlling unit 60 is not limited to the composition described above and may include other compositions capable of obtaining the logic described above.

The pulse driving signal polarity setting unit 110 comprises an Ex (Exclusive)-OR element and sets the polarity of the pulse driving signal in response to the signal level inputted to the FPR terminal As shown in the figure, in the case where a P-channel MOS-type FET is employed as the switching element 50, the pulse driving signal polarity setting unit 110 sets the polarity of the pulse driving signal outputted from the FPCON terminal at the level L when the P-channel MOS-type FET is turned on, and at the level H when the P-channel MOS-type FET is turned off. The pulse driving signal polarity setting unit 110 is not limited to the Ex-OR element and may comprise other elements capable of realizing the above logic.

Figure 5:
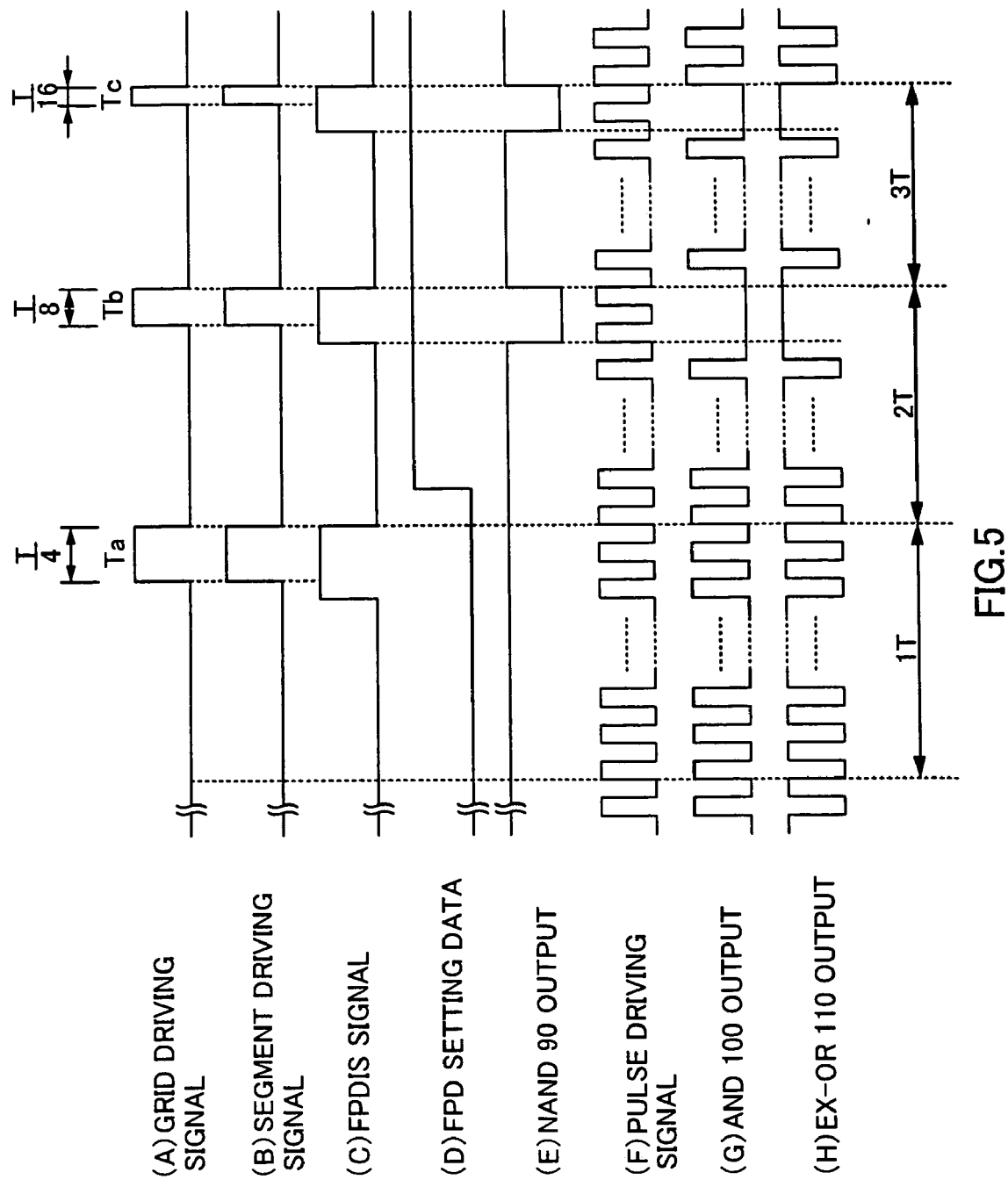
FIG. 5 is a timing chart illustrating the operation of the filament pulse controlling unit according to an embodiment of the invention.

FIG. 5 shows a timing chart illustrating the operation of the filament pulse controlling unit 212 having the composition described above.

First, as the waveform diagram shown in FIG. 5 (A) and (B), the case where dimming is executed at the VFD driving circuit 20 such that the duty ratios of the grid driving signal and the segment driving signal are reduced by "¼", "⅛", "1/16" is assumed.

Here, since the FPD setting data (FIG. 5 (D)) is at the level L for the time period 1T shown in FIG. 5, FPDIS signal (FIG. 5 (C)) is made invalid and the output (FIG. 5 (E)) of the NAND element 90 is at the level H. Therefore, the pulse driving signal (FIG. 5 (F)) generated at the pulse driving signal generator 70 is made valid even for the ON period (Ta) and is supplied to the switching element 50 through the AND element 100 (FIG. 5 (G)) and the Ex-OR element 110 (FIG. 5 (H)).

On the other hand, since the FPD setting data (FIG. 5 (D)) is at the level H in the time periods 2T, 3T, the FPDIS signal (FIG. 5 (C)) is made valid and the output (FIG. 5 (E)) of the NAND element is at the level L for the time period of the pulse width of the FPDIS signal (FIG. 5 (C)). Therefore, the pulse driving signal (FIG. 5 (F)) generated at the pulse driving signal generating unit 70 is made invalid in the ON period (Tb, Tc) and is supplied to the switching element 50 at a logic value (the level H: FIG. 5 (H)) that makes the switching element 50 off.

In this manner, the VFD driving circuit 20, when the period in which the grid electrode 12 and the segment electrode 13 are both at the voltage at which they are driven is short (for example, when the period for the voltage is approximately ⅛ of one (1) cycle or shorter), can execute desired adjustment of the intensity by dimming by making the potential difference between the filament 11, and the grid electrode 12 and the segment electrode 13 to be constant for the period. Therefore, the circuit's convenience can be improved.

Furthermore, the VFD driving circuit 20 can set the validity or invalidity of the above-described function itself based on the FPD setting data, for example, checking the intensity of the display of the VFD 10 from the external controller 40. Therefore, the circuit's convenience can be further improved.

== FPDIS Signal Generating Unit ==

The FPDIS signal generating unit 80, based on the dimmer adjustment data received from the external controller 40, can generate a signal having a pulse width in response to the dimmer value corresponding to the dimmer adjustment data (a value capable of being set as the duty ratios of the grid driving signal and the segment driving signal) as the FPDIS signal.

Figure 6:
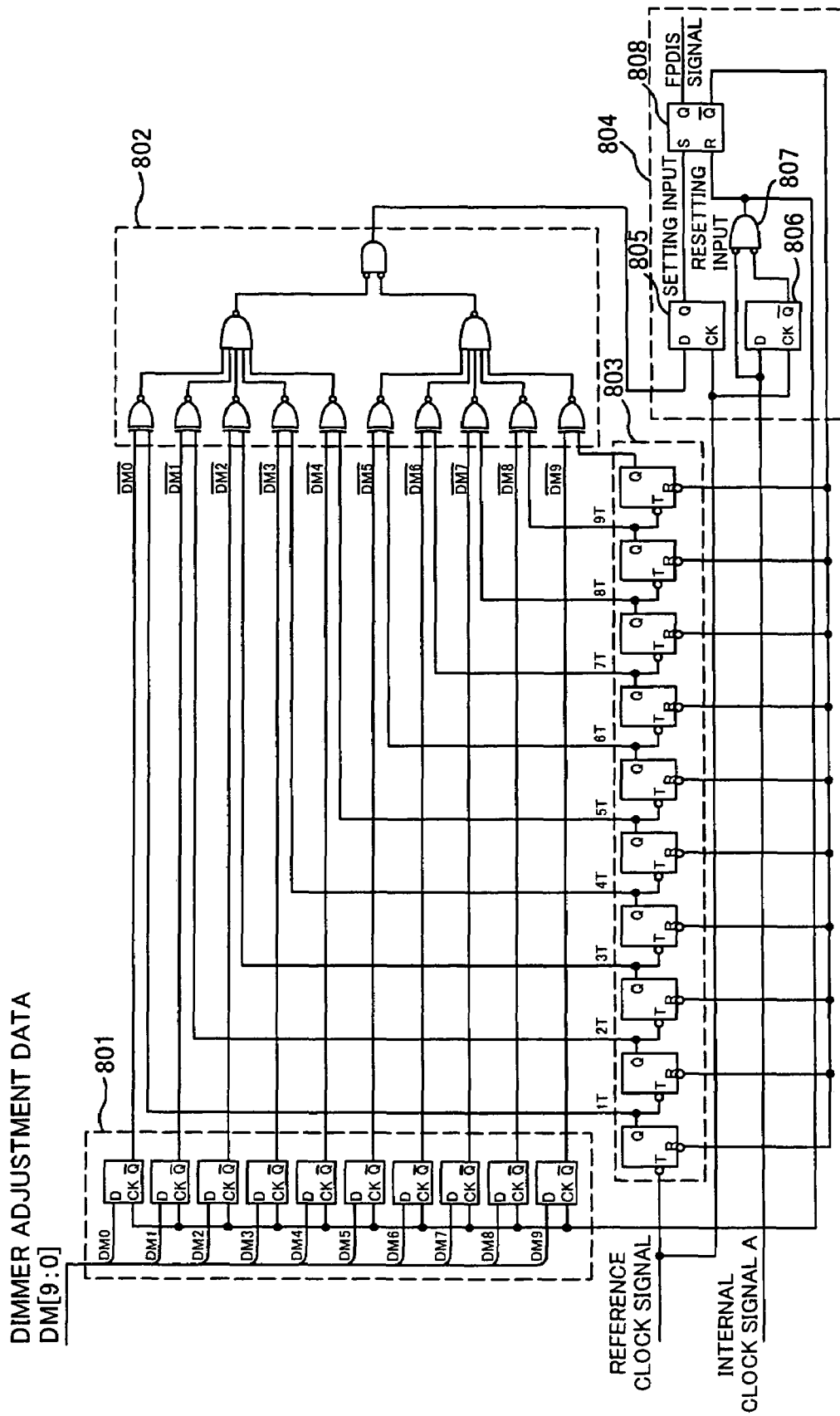
FIG. 6 shows the composition of an FPD controlling unit according to an embodiment of the invention.

The FPDIS signal generating unit 80 can be realized with, for example, a circuit composition shown in FIG. 6. An embodiment of the FPDIS signal generating unit 80 shown in FIG. 6 will be described using as necessary timing charts of the main signal of the FPDIS signal generating unit 80 shown in FIG. 7.

The FPDIS signal generating unit 80 comprises a latching unit 801, a comparing unit 802, a counting unit 803 and a signal generating unit 804.

Figure 7:
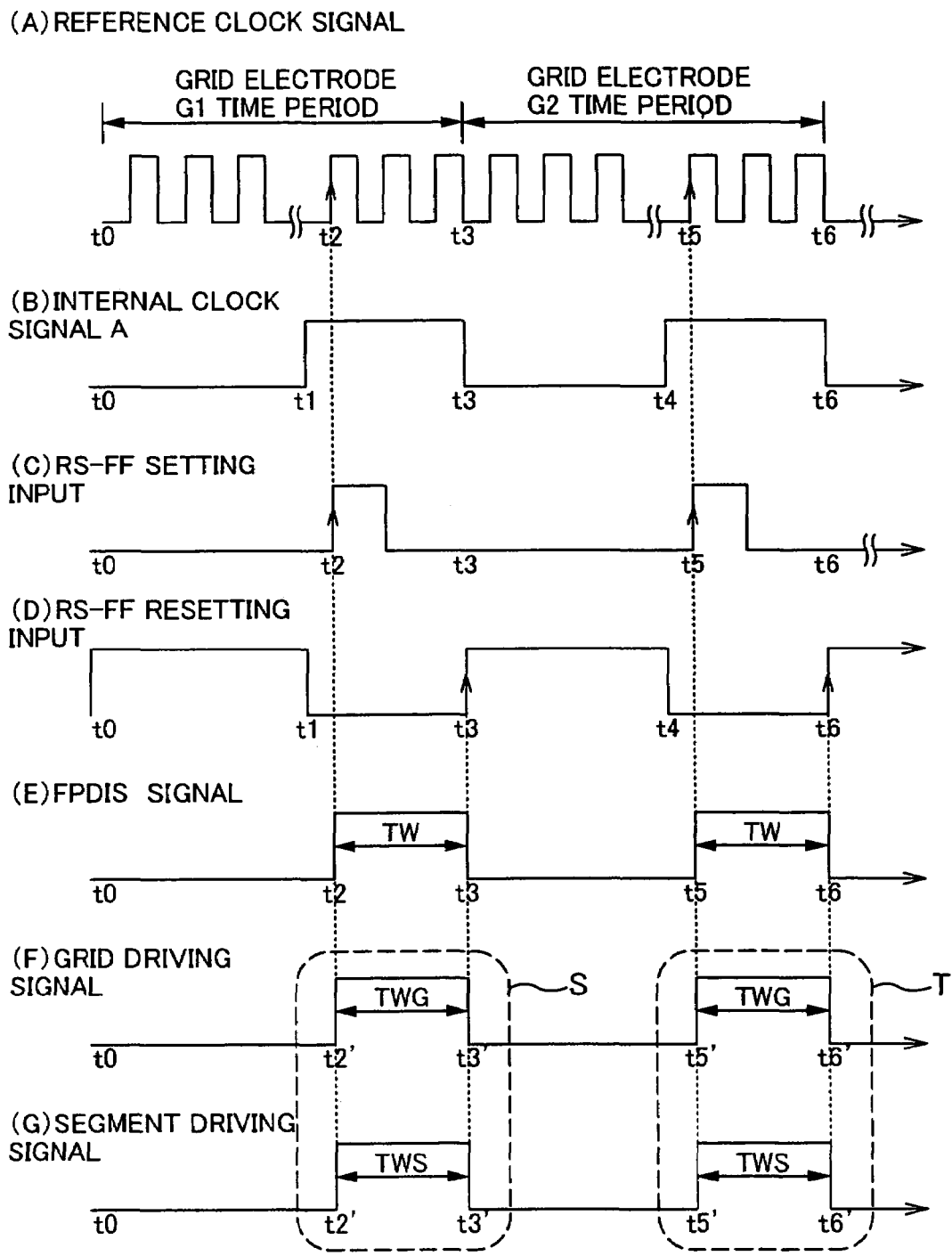
FIG. 7 is a timing chart illustrating the operation of the FPD controlling unit according to an embodiment of the invention.

The latch unit 801 comprises a D flip-flop and latches the dimmer adjustment data (DM0-DM9) received from the external controller 40 as information for generating the FPDIS signal (FIG. 7 (E)). The timing for latching the dimmer adjustment data is, for example, as shown in FIG. 6, the moment of the rise (t0, t3, t6) at the resetting input (FIG. 7 (D)) of a an RS flip-flop 808.

The comparing unit 802 comprises an Ex-NOR element, an NAND element and an NOR element, compares each bit inverted from the dimmer adjustment data (DM0-DM9) latched at the latching unit 801 with count values (1T-9T) based on the reference clock signal outputted from the counting unit 803 and outputs "1" when they coincide with each other and "0" when they do not coincide with each other.

The counting unit 803 comprises a T flip-flop having a reset terminal and generates count values (1T-9T) by dividing as predetermined (into nine (9) in FIG. 6) reference clock signal generated at the oscillation circuit 202 as well as resets the count values (1T-9T) at the moment of the fall (t0, t3, t6) of an inverted output of an RS flip-flop 808 described later, that is a signal having the opposite polarity against the FPDIS signal (FIG. 7 (E)).

The signal generating unit 804 comprises D flip-flops 805 and 806, an NOR element 807 and the RS flop-flop 808.

The D flip-flop 805 sets the output from the comparing unit 802 at the moment of the rise (t2) of the reference clock signal as well as inputs it into a setting terminal of the RS flip-flop 808 (FIG. 7 (C) The time t2 shown in FIG. 7 indicates the time at which the count values (1T-9T) counted from a time to at the counting unit 803 and each bit obtained by inverting the dimmer adjustment data (DM0-DM9) latched by the latching unit 801 coincide with each other.

The D flip-flop 806, based on an internal clock signal A (FIG. 7 (B)) having a cycle with time period in which each of the grid electrodes G1-G2 is driven, inputs into the reset terminal of the RS flip-flop 808 the signal obtained by inverting the internal clock signal A (FIG. 7 (B)) through the AND element 807 (FIG. 7 (D)).

The RS flop-flop 808, based on the setting input (FIG. (C) ) and the resetting input (FIG. 7 (D)), outputs the FPDIS signal shown in FIG. 7 (E)). The pulse width TW of the FPDIS signal is identical to the pulse width TWG of the grid driving signal (FIG. 7 (F)) and the pulse width TWS of the segment driving signal (FIG. (G)) adjusted based on the same dimmer adjustment data at the dimmer adjusting unit 211, or includes their pulse widths TWG and TWS.

In this manner, the FPDIS signal generating unit 80, based on the dimmer adjustment data received from the external controller 40, generates the FPDIS signal for making the pulse driving signal shown in the dotted line area S and T in FIG. 7 to be invalid for the ON period only. The FPDIS signal generating unit 80 is not limited to the one having the composition described above and may have any composition capable of realizing the logic described above.

The VFD driving circuit 20, by having the FPDIS signal generating unit 80, even in the case where the time period in which both of the grid electrode 12 and the segment electrode 13 are driven is short, it is possible to execute desired adjustment of the intensity by dimming by making the potential difference between the filament 11, and the grid electrode 12 and the segment electrode 13 to be constant for the time period. Therefore, the circuit's convenience can be improved.

In the embodiment described above, the VRD driving circuit 20, based on the dimmer adjustment data received from the external controller 40, may make the pulse driving signal invalid in the case where the time period of the pulse width in response to the dimmer value (the value capable of being set as the duty ratio of the grid driving signal and the segment driving signal) corresponding to the dimmer adjustment data is shorter than a predetermined time period (for example, approximately ⅛ of one (1) cycle of the grid driving signal and the segment driving signal).

In this manner, every time the VFD driving circuit 20 receives the dimmer adjustment data from the external controller 40, it can determine automatically the case where it should make the pulse driving signal invalid based on the received dimmer adjustment data. Therefore, the circuit's convenience can be further improved.

Furthermore, in the embodiment described above, the VFD driving circuit 20 may be a semiconductor integrated circuit, and an interface (FPCON terminal) for making the switching element 50 for generating a voltage to pulse-drive the filament 11 be capable of connecting with exterior may be equipped in it.

Furthermore, in the embodiment described above, the switching element 50 may be equipped in various application circuits using the VFD driving circuit 20 (for example, a vacuum fluorescent display module). Preferably, the VFD driving circuit 20 may be a semiconductor integrated circuit and the switching element 50 may be connectable with exterior, or may be a semiconductor integrated circuit embedded with an integrated switching element 50.

Second Embodiment

As a second embodiment according to the invention, the filament pulse controlling unit 212, in the case where the pulse driving signal is made valid, has a function for setting either one of the pulse width or the pulse cycle of the pulse driving signal based on the pulse width data and the pulse cycle data received from the external controller 40.

For describing the above function, first an embodiment of the pulse width data and the pulse cycle data will be described referring to FIGS. 9 and 10.

== Pulse Width Data ==

Figures 8, 9, 10:
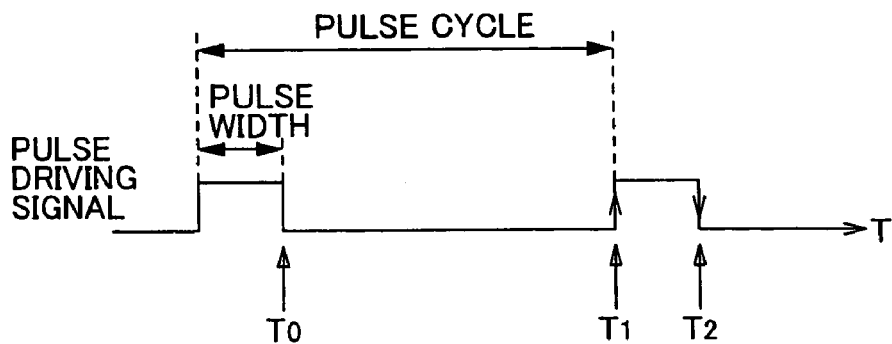
FIG. 8 is a diagram showing the waveform of a pulse driving signal.
FIG. 9 is a reference table relating to the settings of pulse width data according to an embodiment of the invention.
FIG. 10 is a reference table relating to the settings of pulse cycle data according to an embodiment of the invention.

FIG. 9 is a reference table relating to the settings of pulse width data.

As shown in the figure, the pulse width data transmitted from the external controller 40 is, for example, 4-bit serial data Wn (W0-W3) for which the W0 is the LSB (Least Significant Bit). The external controller 40 transmits to the VFD driving circuit 20 the 4-bit serial data Wn (W0-W3) as pulse width data, including the serial data Wn in the 16-bit control data transmitted in the G2 sequence described above.

On the other hand, the pulse width data (W0-W3) is correlated with the set value of the pulse width of the pulse driving signal and decoded into the set value of the pulse width in the VFD driving circuit 20. The set value of the pulse width may be, for example, a value based on the cycle (1/fosc (the frequency of the reference clock signal)) of the reference clock signal generated at the oscillation circuit 202. In this case, the pulse width of the pulse driving signal is a value calculated by "the set value of the pulse width/fosc".

According to the figure, as a design approach, setting of the pulse width is prohibited in the case where the pulse width data (W0-W3) is "0000". However, for example, set value of the pulse width may be assigned from the pulse width data (W0-W3) being "0000". In addition, the number of bits of the serial data Wn as the pulse width data is not limited to four (4) bits described above and should be set at an appropriate value such that the pulse width setting of the pulse driving signal has a desired resolution.

The VFD driving circuit 20 can thus to set finely the pulse width of the pulse driving signal (i. e., the filament pulse voltage) at a proper timing based on these pulse width data.

== Pulse Cycle Data ==

FIG. 10 shows a reference table relating to the pulse cycle data.

As shown in the figure, the data transmitted from the external controller 40 as the pulse cycle data is, for example, 7-bit serial data (C0-C6) having C0 as the LSB. The external controller 40 transmits to the VFD driving circuit 20 the 7-bit serial data (C0-C6) as pulse cycle data, including the serial data (C0-C6) in the 16-bit control data transmitted in the G2 sequence described above.

On the other hand, the pulse cycle data (C0-C6) is correlated with the set value of the pulse cycle of the pulse driving signal and decoded into the set value of the pulse cycle in the VFD driving circuit 20. The set value of the pulse cycle may be a value based on the cycle (1/fosc (the frequency of the reference clock signal)) of the reference clock signal generated at the oscillation circuit 202. In this case, the pulse cycle of the pulse driving signal is a value calculated by "the set value of the pulse cycle/fosc".

According to the figure, as a design approach, setting of the pulse cycle is prohibited in the case where the binary data (C0-C6) is "0000" and "1111". However, for example, setting value of the pulse cycle may be assigned from the binary data (C0-C6) being "0000".

In addition, the number of bits of the serial data Cn as the pulse cycle data is not limited to seven (7) bits described above and should be set at an appropriate value such that the pulse cycle setting of the pulse driving signal can attain a desired resolution.

The VFD driving circuit 20 can thus set finely the pulse cycle of the pulse driving signal (i.e., the filament pulse voltage) at a proper timing based on these pulse cycle data.

== Filament Pulse Controlling Unit ==

Figure 11:
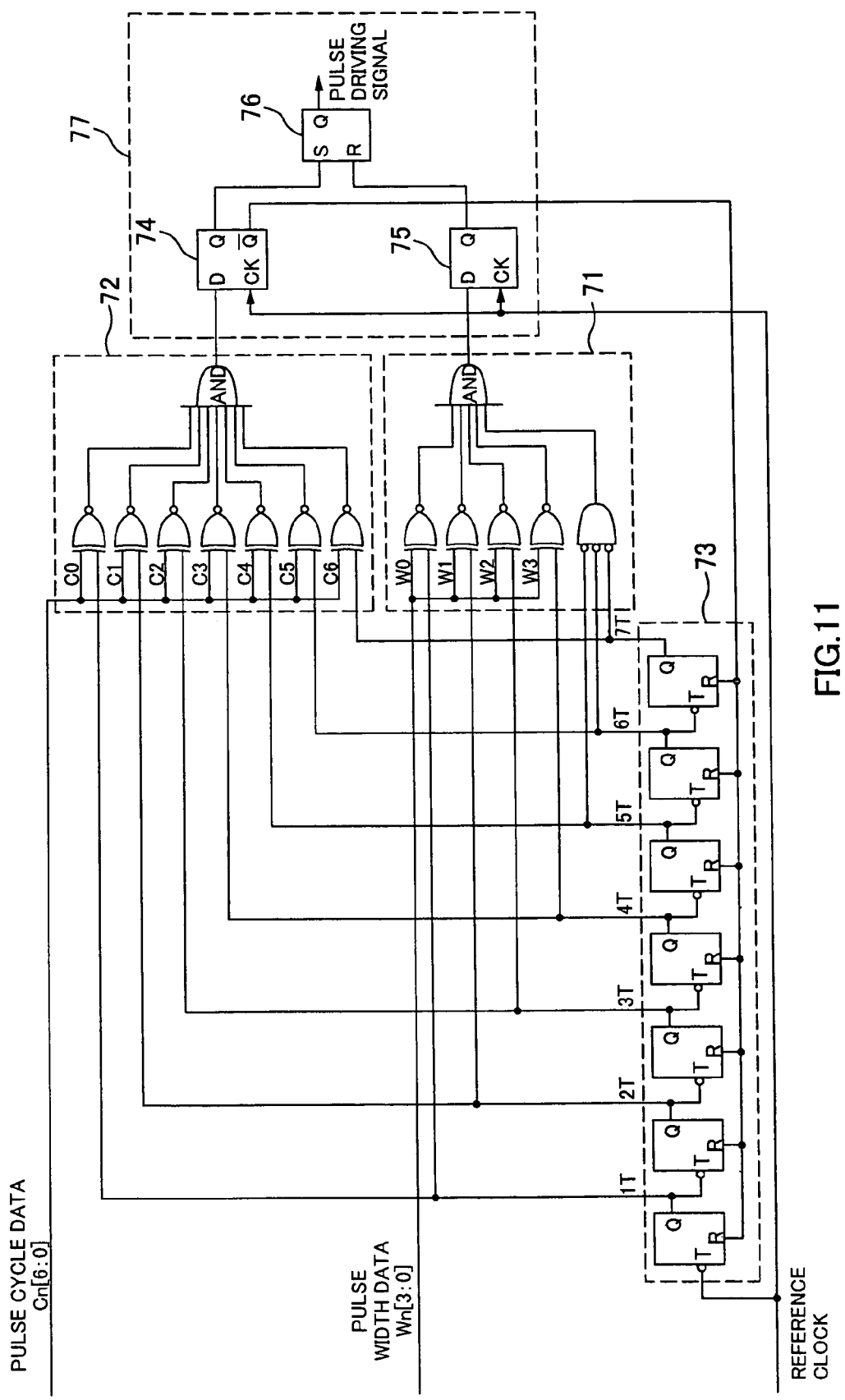
FIG. 11 shows the composition of the filament pulse controlling unit according to an embodiment of the invention.
Figure 12:
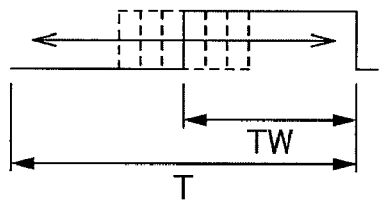
FIG. 12 is a reference table of dimmer adjustment data and dimmer values.
Figure 13:
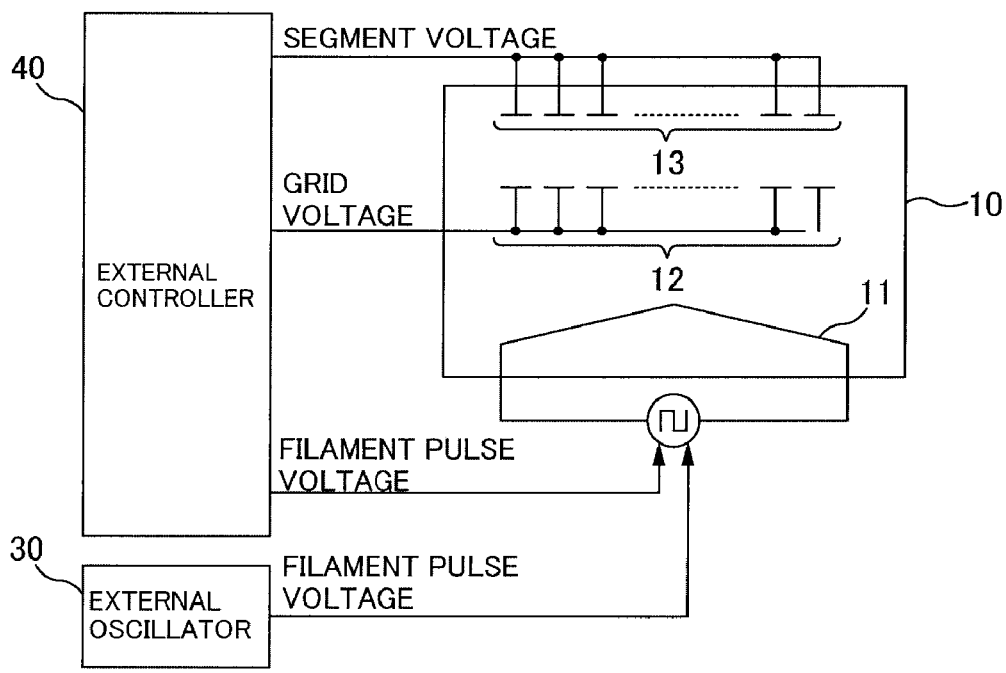
FIG. 13 illustrates a conventional driving circuit for a vacuum fluorescent display.

FIG. 11 shows the composition of the filament pulse controlling unit 212 according to a second embodiment of the invention. The filament pulse controlling unit 212 shown in FIG. 11 is an embodiment for realizing the setting of the pulse width shown in FIG. 9 and the setting of the pulse cycle shown in FIG. 10.

The filament pulse controlling unit 212 comprises a first comparing unit 71, a second comparing unit 72, a counting unit 73 and a pulse driving signal generating unit 77.

The first comparing unit 71 compares the pulse width data (W0-W3) received from the external controller 40 with the count values (1T-4T) based on the reference clock signal as the output of the counting unit 73 and comprises, for example, four (4) Ex (Exclusive)-NOR elements and an AND element. That is, the first comparing unit 71 outputs "1" from its AND element in the case where the result of the comparison of corresponding bits between the pulse width data (W0-W3) and the count values (1T-4T) shows coincidence in each of its Ex-NOR element. Furthermore, in the case where the result of the bit comparison shows non-coincidence at any of its Ex-NOR elements, the output of the AND element is "0".

According to FIG. 11, the first comparing unit 71 has a composition in which there is one (1) 3-input (negative logic) AND element other than the composition described above. This AND element enables operation of the first comparing unit 71 only when all count values (5T-7T) are at the L level. In addition, the composition of the first comparing unit 71 is not limited to the composition described above and it may be a gate circuit that compares the pulse width data (W0-W3) with the count value (1T-4T) and outputs the result of the comparison (for example, outputs "1" in case of coincidence), and the quantity of the constituting elements of the gate circuit is changed according to the bit value of the pulse width data.

The second comparing unit 72 compares the pulse cycle data (C0-C6) received from the external controller 40 with the count values (1T-7T) based on the reference clock signal as the output of the counting unit 73 described later and comprises, for example, seven (7) Ex (Exclusive)-NOR elements and an AND element. That is, the second comparing unit 72 outputs "1" from its AND element in the case where the result of the comparison of corresponding bits between the pulse cycle data (C0-C6) and the count values (1T-7T) shows coincidence in each of its Ex-NOR element. Furthermore, in the case where the result of the bit comparison shows non-coincidence at any of its Ex-NOR elements, the output of the AND element is "0".

In addition, the composition of the second comparing unit 72 is not limited to the composition described above and it may be a gate circuit that compares the pulse cycle data (C0-C6) with the count values (1T-7T) and outputs the result of the comparison (for example, outputs "1" in case of coincidence). In this case, the quantity of the constituting elements of the gate circuit is changed according to the bit value of the pulse cycle data.

The counting unit 73 divides the reference clock signal generated by the oscillation circuit 202 into seven (7) and generates count values (1T-7T) and resets the count value (1T-7T) in the unit in the case where the result of bit comparison in the first comparing unit 71 or the second comparing unit 72 shows coincidence (for example, the output of the AND element for the first comparing unit 71 or the second comparing unit 72 is "1").

The counting unit 73 described above can be realized by, for example, a dividing circuit in which seven (7) T flip-flops each having a reset terminal are connected in series as shown in FIG. 11. The counting unit 73 can be constituted in a gate circuit using various flip-flop elements (for example, D flip-flop and JK flip-flop) other than the T flip-flop, the quantity of the constituting elements of the gate circuit is changed as the number of dividing of the reference clock signal is changed in response to the necessary resolution for setting at least either one of the pulse width or the pulse cycle.

The pulse driving signal generating unit 77 puts the pulse driving signal at one level (for example, "0") in the case where the result of each bit comparison in the first comparing unit 71 shows coincidence, and puts the pulse driving signal at the other level (for example, "1") in the case where the result of each bit comparison in the second comparing unit 72 shows coincidence, and comprises, for example, D flip-flops 74 and 75, and an RS flip-flop 76 as shown in FIG. 11.

Next, the operation of the filament pulse controlling unit 212 will be described schematically using FIG. 8.

First, at a time T0 shown in FIG. 8, the counting unit 73 has each bit of its count value (1T-7T) as its output at "0" state (hereinafter, referred to as "reset state"). From this state, the counting unit 73 increments the count value (1T-7T) sequentially based on the reference clock signal as a 128 (two to the seventh power)–decimal counter.

Next, at a time T1 shown in FIG. 8, the count values (1T-7T) as the output of the counting unit 73 coincide with the pulse cycle data (C0-C6) received from the external controller 40 in the second comparing unit 72 and the unit 72 outputs "1" to the D flip-flop 74. Then, "1" is set sequentially at the D flip-flop 74 and RS flip-flop 76 by the rise of the reference clock signal and the pulse driving signal is switched from the level "0" to the level "1".

When "1" is set at the D flip-flop 74, the count values (1T-7T) of the counting unit 73 moves to the reset state and the count values (1T-7T) are incremented.

Next, at a time T2 shown in FIG. 8, the count values (1T-4T) as the output of the counting unit 73 coincide with the pulse width data (W0-W3) received from the external controller 40 in the first comparing unit 71 and the unit 71 outputs "1" to the D flip-flop 75. Then, "1" is set at the D flip-flop 75 by the rise of the reference clock signal and "0" is set at the RS flip-flop 76. Therefore, the pulse driving signal is switched from the level "1" to the level "0".

In this manner, the filament pulse controlling unit 212 can set at least either one of the pulse width or the pulse cycle of the pulse driving signal by putting the pulse driving signal at one level for the time period of the pulse width corresponding to the pulse width data and putting the pulse driving signal at the other level for the time period other than the pulse width in the pulse cycles corresponding to the pulse cycle data.

Furthermore, the filament pulse controlling unit 212 may be arranged to fix the contents of the pulse width data or the pulse cycle data that is not set to the contents of the data used for the previous setting, and receive from the external controller 40 the updated data of the pulse width data or the pulse cycle data to be set and updates only the setting of the pulse width data or the pulse cycle data to be set when either one of the pulse width or the pulse cycle of the pulse driving signal is set. In this case, the VFD driving circuit 20 may receive the pulse width data or the pulse cycle data not to be set, together with the updated data from the external controller 40, or may retain the contents of the data used for the previous setting and use the retained data.

As described above, the VFD driving circuit according to the embodiments of the invention can finely adjust the duty ratio of the pulse driving signal (i.e., a filament voltage) at a proper timing based on the data (the pulse width data and the pulse cycle data) received from the external controller. Furthermore, consequently, degradation of the intensity grade in the display of the VFD 10 and deterioration of the filament 11 can be suppressed. Therefore, the reliability of the VFD driving circuit can be improved.

Furthermore, even when the frequency of the reference clock signal for setting the pulse driving signal is within a predetermined frequency band (in the audible band or above and in the predetermined upper limit frequency or below), it is easy for the VFD driving circuit according to the embodiment of this invention to finely set at least either one of the pulse width or the pulse cycle of the pulse driving signal at a proper timing.

In the embodiments described above, the VFD driving circuit 20 may be a semiconductor integrated circuit, and an interface (for example, FPCON terminal described above) connecting the switching element 50 for generating a filament pulse voltage with exterior may be equipped in the circuit.

Furthermore, in the embodiments described above, the switching element 50 may be equipped in various application circuits using the VFD driving circuit 20 (for example, a vacuum fluorescent display module). In this case, the VFD driving circuit 20 may be a semiconductor integrated circuit and the switching element 50 may be connectable with exterior, or may be a semiconductor integrated circuit integrating the switching element 50 in the circuit.

What is claimed is:

1. A driving circuit for a vacuum fluorescent display having a filament, a grid electrode and a segment electrode, the driving circuit comprising:
   a filament driving unit for driving the filament;
   a grid driving unit for pulse-driving the grid electrode;
   a segment driving unit for pulse-driving the segment electrode; and a controlling unit for enabling or disabling the filament to be heated with an output of the filament driving unit, the controlling unit keeping the filament from being heated with the output of the filament driving unit all through an ON period when the ON period is shorter than a predetermined time period, and enabling the filament to be heated when the ON period is not shorter than the predetermined time period, the ON period being a time period during which a voltage able to drive the grid electrode and the segment electrode is applied to both of the grid electrode and the segment electrode.

2. The driving circuit for a vacuum fluorescent display according to claim 1, wherein the controlling unit outputs a pulse driving signal for pulse-driving the filament.

3. The driving circuit for a vacuum fluorescent display according to claim 1, wherein all through the ON period shorter than the predetermined time period, the controlling unit fixes the output of the filament driving unit at a predetermined level.

4. The driving circuit for a vacuum fluorescent display according to claim 1, wherein
the driving circuit for a vacuum fluorescent display receives a setting data from an exterior, and
wherein the controlling unit:
disables the filament to be heated with the output of the filament driving unit all through the ON period that is shorter than the predetermined time period when the setting data received from the exterior is at the some logic value; and
enables the filament to be heated with the output of the filament driving unit when the setting data received from the exterior is at the other logic value.

5. The driving circuit for a vacuum fluorescent display according to claim 4,
wherein the driving circuit for a vacuum fluorescent display receives from an exterior a dimmer adjustment data correlated with the duty ratio of the output of the grid driving unit or the output of the segment driving unit, and
wherein the ON period is a time period of the pulse width based on the duty ratio corresponding to the received dimmer adjustment data.

6. The driving circuit for a vacuum fluorescent display according to claim 1,
wherein the driving circuit for a vacuum fluorescent display receives from exterior a dimmer adjustment data correlated with the duty ratio of the output of the grid driving unit or the output of the segment driving unit, and
wherein the controlling unit disables the filament to be heated with the output of the filament driving unit all through the ON period when the ON period based on the duty ratio corresponding to the received dimmer adjustment data is shorter than the predetermined time period.

7. The driving circuit for a vacuum fluorescent display according to claim 1, wherein the driving circuit for a vacuum fluorescent display is a semiconductor integrated circuit, the driving circuit enabling a switching element that generates a voltage for pulse-driving the filament to be connected to exterior based on the output of the filament driving unit.

8. The driving circuit for a vacuum fluorescent display according to claim 1, comprising a switching element that generates a voltage for pulse-driving the filament based on the output of the filament driving unit.

9. The driving circuit for a vacuum fluorescent display according to claim 8, wherein the driving circuit for a vacuum fluorescent display is a semiconductor integrated circuit, the driving circuit enabling the switching element to be connected to exterior.

10. The driving circuit for a vacuum fluorescent display according to claim 8, wherein the driving circuit for a vacuum fluorescent display is a semiconductor integrated circuit integrated with the switching elements.

11. A driving circuit for a vacuum fluorescent display having a filament, a grid electrode and a segment electrode, the driving circuit comprising:
a filament driving unit for driving the filament;
a grid driving unit for pulse-driving the grid electrode;
a segment driving unit for pulse-driving the segment electrode; and
a controlling unit for enabling or disabling the filament to be heated with an output of the filament driving unit, the controlling unit setting a pulse width and/or a pulse cycle of a pulse driving signal for pulse-driving the filament based on data received from exterior when enabling the filament to be heated with the output of the filament driving unit.

12. The driving circuit for a vacuum fluorescent display according to claim 11,
wherein the data received from exterior includes pulse width data for setting the pulse width of the pulse driving signal, and
wherein the controlling unit generates the pulse driving signal having a pulse width corresponding to the received pulse width data.

13. The driving circuit for a vacuum fluorescent display according to claim 11,
wherein the data received from exterior includes pulse cycle data for setting the pulse cycle of the pulse driving signal, and
wherein the controlling unit generates the pulse driving signal having a pulse cycle corresponding to the received pulse cycle data.

14. The driving circuit for a vacuum fluorescent display according to claim 11,
wherein the data received from exterior includes pulse width data for setting the pulse width of the pulse driving signal and pulse cycle data for setting the pulse cycle of the pulse driving signal, and
wherein the controlling unit sets the pulse width and/or the pulse cycle of the pulse driving signal by putting the pulse driving signal at one level for a time period of the pulse width corresponding to the received pulse width data, and by putting the pulse driving signal at another level for a time period other than the pulse width among the pulse cycles corresponding to the received pulse cycle data.

15. The driving circuit for a vacuum fluorescent display according to claim 14, wherein the filament pulse controlling unit comprises:
a first comparing unit for comparing the pulse width data with a count value based on a reference clock signal;
a second comparing unit for comparing the pulse cycle data with a count value based on a reference clock signal;
a counting unit for generating the count value by dividing as predetermined the reference clock signal as well as resetting the count value when the result of the comparison at the first comparing unit or the second comparing unit shows coincidence; and
a controlling unit for putting the pulse driving signal at one level when the result of the comparison at the first comparing unit shows coincidence, and for putting the pulse driving signal at the other level when the result of the comparison at the second comparing unit shows coincidence.

16. The driving circuit for a vacuum fluorescent display according to claim 11,
wherein the driving circuit for a vacuum fluorescent display is a semiconductor integrated circuit, the driving unit enabling the switching element that generates a voltage for pulse-driving the filament based on the pulse driving signal to be connected to the exterior.

17. The driving circuit for a vacuum fluorescent display according to claim 11, wherein the driving circuit for a vacuum fluorescent display comprises a switching element that generates a voltage for pulse-driving the filament based on the pulse driving signal.

18. The driving circuit for a vacuum fluorescent display according to claim 17, wherein the driving circuit for a vacuum fluorescent display is a semiconductor integrated circuit, the driving circuit enabling the switching element to be connected to exterior.

19. The driving circuit for a vacuum fluorescent display according to claim 17, wherein the driving circuit for a vacuum fluorescent display is a semiconductor integrated circuit integrated with the switching element.

* * * * *